United States Patent
Li et al.

(10) Patent No.: US 11,183,385 B2
(45) Date of Patent: Nov. 23, 2021

(54) METHOD FOR PASSIVATING SILICON CARBIDE EPITAXIAL LAYER

(71) Applicant: THE 13TH RESEARCH INSTITUTE OF CHINA ELECTRONICS TECHNOLOGY GROUP CORPORATION, Hebei (CN)

(72) Inventors: Jia Li, Shijiazhuang (CN); Weili Lu, Shijiazhuang (CN); Yulong Fang, Shijiazhuang (CN); Jiayun Yin, Shijiazhuang (CN); Bo Wang, Shijiazhuang (CN); Yanmin Guo, Shijiazhuang (CN); Zhirong Zhang, Shijiazhuang (CN); Zhihong Feng, Shijiazhuang (CN)

(73) Assignee: THE 13TH RESEARCH INSTITUTE OF CHINA ELECTRONICS, Hebei (CN)

( * ) Notice: Subject to any disclaimer, the term of this patent is extended or adjusted under 35 U.S.C. 154(b) by 0 days.

(21) Appl. No.: 16/646,249

(22) PCT Filed: Mar. 19, 2018

(86) PCT No.: PCT/CN2018/079468
§ 371 (c)(1),
(2) Date: Mar. 11, 2020

(87) PCT Pub. No.: WO2019/052139
PCT Pub. Date: Mar. 21, 2019

(65) Prior Publication Data
US 2020/0279742 A1    Sep. 3, 2020

(30) Foreign Application Priority Data
Sep. 13, 2017   (CN) .......................... 201710822537.X

(51) Int. Cl.
*H01L 21/04*   (2006.01)
*H01L 21/02*   (2006.01)

(52) U.S. Cl.
CPC ........ *H01L 21/045* (2013.01); *H01L 21/0217* (2013.01); *H01L 21/02211* (2013.01);
(Continued)

(58) Field of Classification Search
None
See application file for complete search history.

(56) References Cited

U.S. PATENT DOCUMENTS 5,013,692 A * 5/1991 Ide .................... H01L 21/28202
                                                          438/381
9,337,027 B2    5/2016 Chung et al.
(Continued)

FOREIGN PATENT DOCUMENTS

CN    103688342 A    3/2014
CN    103872199 A    6/2014
(Continued)

OTHER PUBLICATIONS

International Search Report in the international application No. PCT/CN2018/079468, dated Jun. 8, 2018, 2 pgs.
(Continued)

*Primary Examiner* — Asok K Sarkar
(74) *Attorney, Agent, or Firm* — Cooper Legal Group, LLC

(57) ABSTRACT

The disclosure provides a method for passivating a silicon carbide epitaxial layer, relating to the technical field of semiconductors. The method includes the following steps: introducing a carbon source and a silicon source into a reaction chamber, and growing a silicon carbide epitaxial layer on a substrate; and turning off the carbon source, introducing a nitrogen source and a silicon source into the reaction chamber, and growing a silicon nitride thin film on an upper surface of the silicon carbide epitaxial layer. The silicon nitride thin film grown by the method has few defects (Continued)

and high quality, and may be used as a lower dielectric layer of a gate electrode in a field effect transistor. It does not additionally need an oxidation process to form a $SiO_2$ dielectric layer, thereby reducing device fabrication procedures.

8 Claims, 2 Drawing Sheets

(52) U.S. Cl.
CPC .. *H01L 21/02271* (2013.01); *H01L 21/02378* (2013.01); *H01L 21/02381* (2013.01); *H01L 21/02529* (2013.01); *H01L 21/02634* (2013.01)

(56) References Cited

U.S. PATENT DOCUMENTS

| | | | | |
|---|---|---|---|---|
| 2007/0235757 | A1* | 10/2007 | Agarwal | H01L 29/1004 257/187 |
| 2010/0006859 | A1 | 1/2010 | Gilyong | |
| 2014/0203297 | A1 | 7/2014 | Chung et al. | |
| 2014/0284613 | A1* | 9/2014 | Kuraguchi | H01L 23/291 257/76 |

FOREIGN PATENT DOCUMENTS

| | | |
|---|---|---|
| CN | 105140102 A | 12/2015 |
| CN | 105244255 A | 1/2016 |
| CN | 106057914 A | 10/2016 |
| CN | 107104172 A | 8/2017 |
| CN | 107578988 A | 1/2018 |

OTHER PUBLICATIONS

English translation of the Written Opinion of the International Search Authority in the international application No. PCT/CN2018/079468, dated Jun. 8, 2018, 4 pgs.

* cited by examiner

METHOD FOR PASSIVATING SILICON CARBIDE EPITAXIAL LAYER

TECHNICAL FIELD

The disclosure relates to the technical field of semiconductors, and more particularly, to a method for passivating a silicon carbide epitaxial layer.

BACKGROUND

Silicon carbide materials have the characteristics of wide band gap, high thermal conductivity, high breakdown field strength, and high electron saturation drift speed. They are important materials for preparing power electronic devices with high-temperature resistance and high-power. In a process of a SiC field effect transistor device, oxidation is generally used to prepare $SiO_2$ during the preparation of a lower dielectric layer of a gate electrode. In order to reduce fixed oxide charges and interface trap charges present at a $SiC/SiO_2$ interface, improve the electron mobility in an inversion layer, and improve the device performance, it is also necessary to perform thermal annealing on the $SiO_2$ prepared by the oxidation, which will make the device preparation process very complicated and increase costs.

SUMMARY

Technical Problem

In view of this, embodiments of the disclosure provide a method for passivating a silicon carbide epitaxial layer to solve the technical problem in the conventional art that the preparation process of SiC field effect transistor devices is complicated.

Technical Solution

To solve the above technical problem, the disclosure provides a method for passivating a silicon carbide epitaxial layer.

The method includes the following steps:

a carbon source and a silicon source are introduced into a reaction chamber, and a silicon carbide epitaxial layer is grown on a substrate; and the carbon source and the silicon source introduced into the reaction chamber are turned off, a nitrogen source and a silicon source are introduced into the reaction chamber, and a silicon nitride thin film is grown on an upper surface of the silicon carbide epitaxial layer.

Optionally, the substrate is a silicon substrate.

Further, the silicon carbide epitaxial layer is growing at a temperature of 1000° C. to 1400° C.

Further, the silicon nitride thin film is growing at a temperature of 500° C. to 1400° C.

Optionally, the substrate is a silicon carbide substrate.

Further, the silicon carbide epitaxial layer is growing at a temperature of 1000° C. to 2000° C.

Further, the silicon nitride thin film is growing at a temperature of 500° C. to 2000° C.

Optionally, the silicon nitride thin film has a thickness of 0.1 nm to 1 µm.

Optionally, a nitrogen/silicon atomic ratio of the nitrogen source and the silicon source is ranging from 0.1 to 10.

Optionally, the carbon source is propane, methane or ethylene; the silicon source is silane, trichlorosilane or dichlorosilane; and the nitrogen source is nitrogen or ammonia.

Beneficial Effect

The beneficial effect produced by the above technical solution is as follows. In the embodiments of the disclosure, a carbon source and a silicon source are introduced into a reaction chamber, and a silicon carbide epitaxial layer is grown on a substrate. After growing the silicon carbide epitaxial layer, the carbon source and the silicon source are turned off, a nitrogen source and a silicon source are introduced into the reaction chamber, and a silicon nitride thin film is grown on an upper surface of the silicon carbide epitaxial layer. The grown silicon nitride thin film has few defects and high quality, and may be used as a lower dielectric layer of a gate electrode in a field effect transistor. It does not additionally need an oxidation process to form a $SiO_2$ dielectric layer, so that subsequent oxidation and annealing processes are avoided. The silicon nitride thin film is grown by using the same equipment for growing the silicon carbide epitaxial layer, thereby reducing device fabrication procedures and reducing costs.

DETAILED DESCRIPTION

In order to make the objectives, technical solutions and advantages of the disclosure clearer, the disclosure will be further elaborated below with reference to the drawings and the embodiments. It will be appreciated that specific embodiments described here are only used to explain the disclosure without limiting the disclosure.

Figure 1:
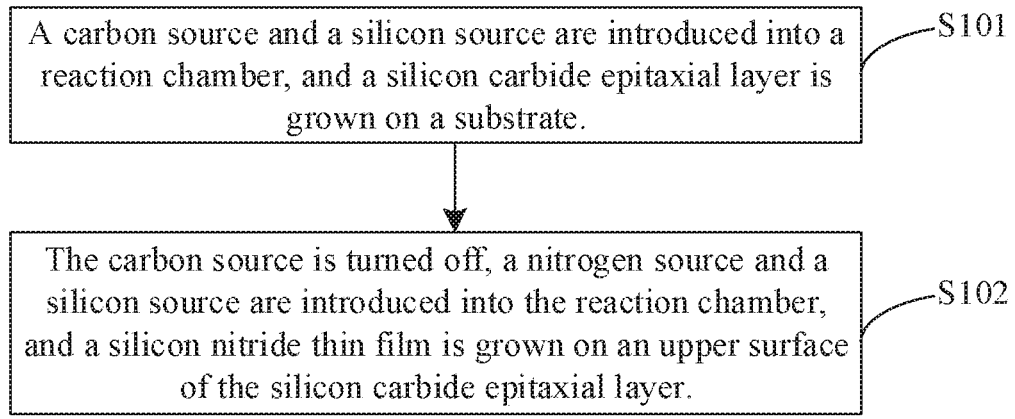
FIG. 1 is a schematic flowchart of a method for passivating a silicon carbide epitaxial layer according to an embodiment of the disclosure.

Referring to FIG. 1, FIG. 1 is a schematic flowchart of a method for passivating a silicon carbide epitaxial layer according to an embodiment 1 of the disclosure. The method includes the following steps.

In step S101, a carbon source and a silicon source are introduced into a reaction chamber, and a silicon carbide epitaxial layer is grown on a substrate.

Optionally, the carbon source is propane, methane or ethylene. The silicon source is silane, trichlorosilane or dichlorosilane.

In the embodiments of the disclosure, the carbon source and the silicon source are introduced into the reaction chamber through a carrier gas. The silicon carbide epitaxial layer is grown on the substrate by Chemical Vapor Deposition (CVD). The carbon source includes, but is not limited to, propane, methane, ethylene or other olefinic gases. The silicon source includes, but is not limited to, silane, trichlorosilane or dichlorosilane. The method for growing the silicon carbide epitaxial layer may also be Metal-Organic Chemical Vapor Deposition (MOCVD) and Hydride Vapor Phase Epitaxy (HVPE). The silicon carbide epitaxial layer may be N-type doped or P-type doped, which is not limited herein. The carrier gas may be hydrogen.

In step S102, the carbon source and the silicon source introduced into the reaction chamber are turned off, a nitrogen source and a silicon source are introduced into the reaction chamber, and a silicon nitride thin film is grown on an upper surface of the silicon carbide epitaxial layer.

Optionally, the nitrogen source is nitrogen or ammonia.

In the embodiments of the disclosure, after growing the SiC epitaxial layer with a desired thickness, a SiN thin film is grown using the same equipment. The specific growing method is as follows: the carbon source and the silicon source introduced into the reaction chamber are turned off, and continuously a nitrogen source and a silicon source are introduced into the reaction chamber through a carrier gas. The nitrogen source is ammonia or nitrogen. The nitrogen/silicon atomic ratio of the nitrogen source and the silicon source is adjusted, and the silicon nitride thin film is grown on the upper surface of the silicon carbide epitaxial layer by a CVD process.

In the embodiments of the disclosure, the silicon carbide epitaxial layer is grown on the substrate by introducing the carbon source and the silicon source into the reaction chamber. After growing the silicon carbide epitaxial layer, the carbon source and the silicon source are turned off, and the nitrogen source and the silicon source are introduced into the reaction chamber, and the silicon nitride thin film is grown on the upper surface of the silicon carbide epitaxial layer. The grown silicon nitride thin film has few defects and high quality, and may be used as a lower dielectric layer of a gate electrode in a field effect transistor. The silicon nitride dielectric layer formed by the method does not need an oxidation process and a subsequent annealing process. The silicon nitride thin film is grown by using the same equipment for growing the silicon carbide epitaxial layer, thereby reducing device fabrication procedures and reducing costs.

Optionally, the substrate is a silicon substrate.

Further, the silicon carbide epitaxial layer is growing at a temperature of 1000° C. to 1400° C., most preferably 1100° C. to 1200° C.

Furthermore, the silicon nitride thin film is growing at a temperature of 500° C. to 1400° C., most preferably 1000° C. to 1100° C.

In the embodiments of the disclosure, a SiC epitaxial layer may be grown on a Si substrate. The growth temperature of the SiC epitaxial layer on the Si substrate is 1000° C. to 1400° C., and the growth temperature of the SiN thin film is 500° C. to 1400° C. The growth temperature of the SiC epitaxial layer is higher. By using the same equipment for growing the SiC epitaxial layer to grow the SiN thin film, it is possible to ensure a higher temperature when growing the SiN thin film, thereby reducing the defects of the SiN thin film.

Optionally, the substrate is a silicon carbide substrate.

Further, the silicon carbide epitaxial layer is growing at a temperature of 1000° C. to 2000° C., most preferably 1500° C. to 1600° C.

Furthermore, the silicon nitride thin film is growing at a temperature of 500° C. to 2000° C., most preferably 1000° C. to 1100° C.

In the embodiments of the disclosure, the SiC epitaxial layer may be grown on a SiC substrate. The growth temperature of the SiC epitaxial layer on the SiC substrate is 1000° C. to 2000° C., and the growth temperature of the SiN thin film is 500° C. to 2000° C. The growth temperature of the SiC epitaxial layer is higher. By using the same equipment for growing the SiC epitaxial layer to grow the SiN thin film, it is possible to ensure a higher temperature when growing the SiN thin film, thereby reducing the defects of the SiN thin film.

The growth temperature of the silicon nitride thin film may be lower than the growth temperature of the silicon carbide epitaxial layer. For example, the temperature of the reaction chamber is increased to 1200° C., the carbon source and the silicon source are introduced into the reaction chamber, and the silicon carbide epitaxial layer is grown on the silicon substrate. Then, the carbon source and the silicon source introduced into the reaction chamber are turned off, and the temperature of the reaction chamber is reduced to 1000° C. Subsequently, the nitrogen source and the silicon source are introduced into the reaction chamber, and the silicon nitride thin film is grown on the silicon carbide epitaxial layer. The growth temperature of the silicon nitride thin film may also be the same as the growth temperature of the silicon carbide epitaxial layer. For example, the temperature of the reaction chamber is increased to 1000° C., the carbon source and the silicon source are introduced into the reaction chamber, and the silicon carbide epitaxial layer is grown on the silicon substrate. Then, the temperature remains unchanged, the carbon source introduced into the reaction chamber is turned off, the silicon source continues to be introduced into the reaction chamber, the nitrogen source is introduced into the reaction chamber, and the silicon nitride thin film is grown on the silicon carbide epitaxial layer.

Optionally, the silicon nitride thin film has a thickness of 0.1 nm to 1 μm. The thickness of the SiN thin film may be adjusted according to actual needs.

Optionally, a nitrogen/silicon atomic ratio of the nitrogen source and the silicon source is ranging from 0.1 to 10.

Figure 2:
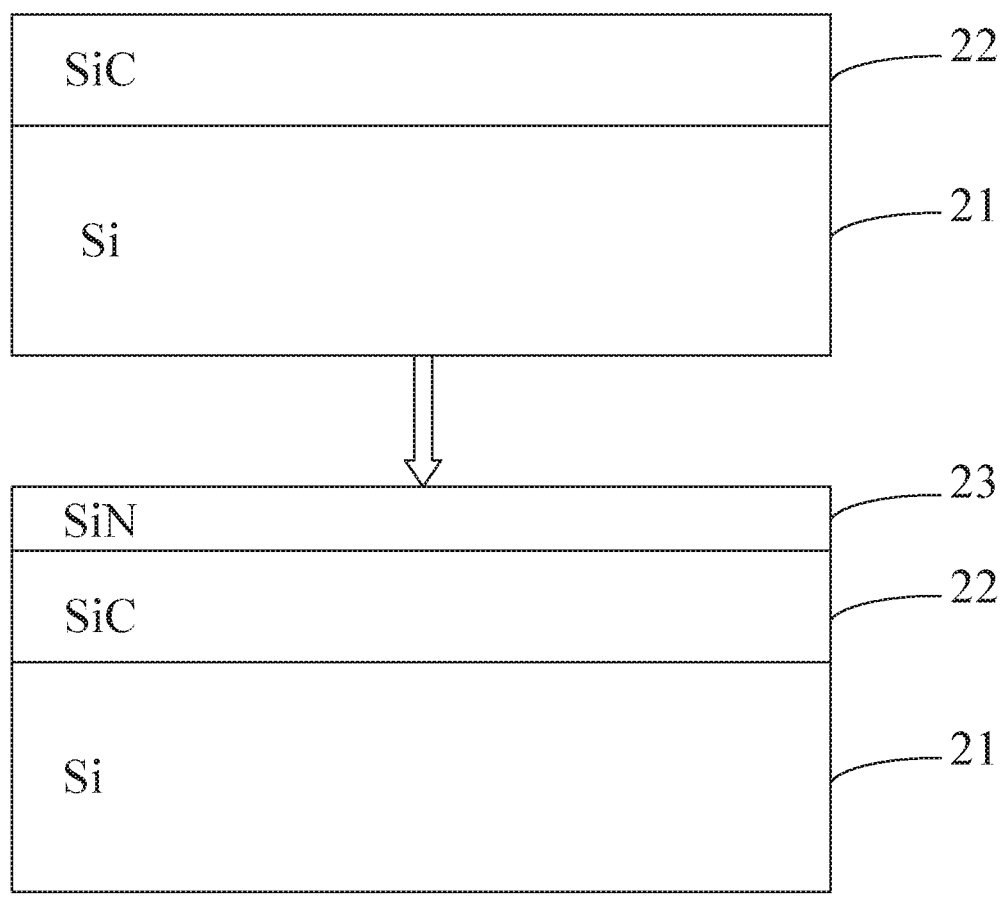
FIG. 2 is a structural block diagram of a method for passivating a silicon carbide epitaxial layer according to an embodiment of the disclosure.

Referring to FIG. 2, the method for passivating a silicon carbide epitaxial layer includes that: firstly, propane and trichlorosilane are introduced into a reaction chamber, and a SiC epitaxial layer 22 having a thickness of 200 nm is grown on a Si substrate 21 at a temperature of 1100° C. After the SiC epitaxial layer 22 is grown, the temperature remains unchanged, propane is turned off, trichlorosilane continues to be introduced, and nitrogen is introduced. The flow rates of trichlorosilane and nitrogen are adjusted so that a nitrogen/silicon atomic ratio is 1, and a silicon nitride thin film 23 is grown on an upper surface of the epitaxial layer.

The above description is merely used to illustrate the preferred embodiments of the disclosure and is not intended to limit the disclosure. Any modifications, equivalent replacements, improvements and the like made within the spirit and principle of the disclosure should fall within the scope of the disclosure.

The invention claimed is:

1. A method for passivating a silicon carbide epitaxial layer, comprising the following steps:
   introducing a carbon source and a silicon source into a reaction chamber, and growing a silicon carbide epitaxial layer on a substrate; and
   turning off the carbon source and the silicon source introduced into the reaction chamber, introducing a nitrogen source and a second silicon source into the reaction chamber, and growing a silicon nitride thin film on an upper surface of the silicon carbide epitaxial layer,
   wherein the silicon nitride thin film is grown at a temperature of 1000° C. to 1100° C.

2. The method for passivating a silicon carbide epitaxial layer of claim 1, wherein the substrate is a silicon substrate.

3. The method for passivating a silicon carbide epitaxial layer of claim 2, wherein the silicon carbide epitaxial layer is grown at a temperature of 1000° C. to 1400° C.

4. The method for passivating a silicon carbide epitaxial layer of claim 1, wherein the substrate is a silicon carbide substrate.

5. The method for passivating a silicon carbide epitaxial layer of claim 4, wherein the silicon carbide epitaxial layer is grown at a temperature of 1000° C. to 2000° C.

6. The method for passivating a silicon carbide epitaxial layer of claim 1, wherein the silicon nitride thin film has a thickness of 0.1 nm to 1 μm.

7. The method for passivating a silicon carbide epitaxial layer of claim 1, wherein a nitrogen/silicon atomic ratio of the nitrogen source and the second silicon sources ranges from 0.1 to 10.

8. The method for passivating a silicon carbide epitaxial layer of claim 1, wherein the carbon source is propane, methane or ethylene; the second silicon source is siliane, trichlorosilane or dichlorosilane; and the nitrogen source is nitrogen or ammonia.

\* \* \* \* \*

UNITED STATES PATENT AND TRADEMARK OFFICE
CERTIFICATE OF CORRECTION

PATENT NO. : 11,183,385 B2  
APPLICATION NO. : 16/646249  
DATED : November 23, 2021  
INVENTOR(S) : Jia Li et al.

Page 1 of 1

It is certified that error appears in the above-identified patent and that said Letters Patent is hereby corrected as shown below:

On the Title Page

Item (73) titled Assignee, Please delete:
"The 13th Research Institute of China Electronics"

And replace with:
The 13th Research Institute of China Electronics Technology Group Corporation Signed and Sealed this
Fourth Day of July, 2023

Katherine Kelly Vidal
*Director of the United States Patent and Trademark Office*